United States Patent
Payer et al.

(10) Patent No.: US 10,169,451 B1
(45) Date of Patent: Jan. 1, 2019

(54) RAPID CHARACTER SUBSTRING SEARCHING

(71) Applicant: International Business Machines Corporation, Armonk, NY (US)

(72) Inventors: Stefan Payer, Stuttgart (DE); Razvan Peter Figuli, Remchingen (DE); Cedric Lichtenau, Stuttgart (DE); Michael Klein, Schoenaich (DE)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/957,984

(22) Filed: Apr. 20, 2018

(51) Int. Cl.
| | | |
|---|---|---|
| *H03K 19/173* | (2006.01) |
| *G06F 17/30* | (2006.01) |
| *H03K 19/177* | (2006.01) |
| *G06F 17/16* | (2006.01) |
| *G06F 9/30* | (2018.01) |
| *H03K 19/20* | (2006.01) |

(52) U.S. Cl.
CPC ...... *G06F 17/3069* (2013.01); *G06F 9/30029* (2013.01); *G06F 17/16* (2013.01); *H03K 19/17704* (2013.01); *H03K 19/20* (2013.01)

(58) Field of Classification Search
CPC .. G06F 17/3069; G06F 9/30029; G06F 17/16; H03K 19/20; H03K 19/17704
USPC .................................................. 326/38, 104
See application file for complete search history.

(56) References Cited

U.S. PATENT DOCUMENTS

| | | | | |
|---|---|---|---|---|
| 4,094,001 A | * | 6/1978 | Miller | G06F 7/02 340/146.2 |
| 4,907,194 A | * | 3/1990 | Yamada | G06F 7/02 365/189.07 |
| 4,955,056 A | * | 9/1990 | Stentiford | G10L 15/00 704/239 |

(Continued)

FOREIGN PATENT DOCUMENTS

| | | |
|---|---|---|
| CN | 101609455 A | 12/2009 |
| EP | 2680166 B1 | 10/2015 |
| WO | 2007076269 A2 | 7/2007 |

OTHER PUBLICATIONS

Abdeen, R., "Start-to-End Algorithm for String Searching", IJCSNS International Journal of Computer Science and Network Security, vol. 11 No. 2, Feb. 2011, pp. 179-182.

(Continued)

*Primary Examiner* — Don Le
(74) *Attorney, Agent, or Firm* — Stosch Sabo (57) ABSTRACT

A processor unit can be used to rapidly search a string of characters. The processor unit can include vector registers each having M vector elements, each vector element having n bits of data for containing an encoded character. An M×M matrix of comparators within the processor unit can be used to compare elements of a first register storing a reference string and elements of a second register storing a target string. A logic gate is associated with each diagonal of the matrix of comparators, and is configured to combine the results of comparators along the diagonal, resulting in a bit vector indicating characters of the target string that fully match the reference string and characters that partially match the reference string. Correction logic within the processor unit can suppress indications of a partial match or of a full match in the bit vector.

16 Claims, 5 Drawing Sheets

(56) References Cited

U.S. PATENT DOCUMENTS

| | | | |
|---|---|---|---|
| 5,757,983 A * | 5/1998 | Kawaguchi | G06F 17/30675 382/218 |
| 7,444,326 B1 | 10/2008 | Jagadish et al. | |
| 7,596,553 B2 | 9/2009 | Meirovitz et al. | |
| 7,756,847 B2 | 7/2010 | Pauws et al. | |
| 7,872,890 B1 | 1/2011 | Starovoytov | |
| 7,991,987 B2 | 8/2011 | Cabot | |
| 8,051,085 B1 | 11/2011 | Srinivasan et al. | |
| 8,296,279 B1 | 10/2012 | Singh | |
| 8,407,245 B2 | 3/2013 | Ryan et al. | |
| 8,620,968 B2 | 12/2013 | Atasu et al. | |
| 9,424,031 B2 | 8/2016 | Thantry et al. | |
| 2007/0133593 A1 | 6/2007 | Shankara | |
| 2008/0040345 A1 | 2/2008 | Cameron | |
| 2008/0050469 A1 | 2/2008 | Kwon et al. | |
| 2011/0252046 A1 | 10/2011 | Szabo et al. | |
| 2013/0086096 A1 | 4/2013 | Indeck et al. | |
| 2014/0095834 A1 | 4/2014 | Kuo | |
| 2014/0189320 A1 * | 7/2014 | Kuo | G06F 9/3001 712/222 |
| 2015/0347532 A1 * | 12/2015 | Shaw | G06F 17/30554 707/722 |
| 2016/0224552 A1 | 8/2016 | Han et al. | |
| 2017/0024439 A1 | 1/2017 | Chavan et al. | |
| 2018/0217836 A1 * | 8/2018 | Johnson | G06F 9/28 |

OTHER PUBLICATIONS

Unknown, "charmatch: Partial String Matching", Sep. 22, 2017, 26 pages.
Unknown, "Java String indexOf Parsing", CodingBat code practice, Code Help and Videos, Sep. 22, 2017, 3 pages.
Lau, K., "Swift Algorithm Club: Boyer Moore String Search Algorithm", raywenderlich.com, Jun. 30, 2017, 8 pages.
Mula, W., "SIMD-friendly algorithms for substring searching", Nov. 28, 2016, Updated on Apr. 29, 2017, 16 pages.
Boyer et al., "A Fast String Searching Algorithm", Communications of the ACM, Oct. 1977, vol. 20, No. 10, pp. 762-772.
Faro et al., "Fast Packed String Matching for Short Patterns", 2013 Proceedings of the Fifteenth Workshop on Algorithm Engineering and Experiments, pp. 113-121.
Intel, "Intel® 64 and IA-32 Architectures Optimization Reference Manual", Order No. 248966-033, Jun. 2016, 672 pages.
Intel, "Intel® SSE4 Programming Reference", Reference No. D91561-003, Jul. 2007, 197 pages.
Karp et al., "Efficient randomized pattern-matching algorithms", IBM Journal Res. Develop., vol. 31, No. 2, Mar. 1987, pp. 249-260.
Knuth et al., "Fast Pattern Matching in Strings", Siam J. Comput., vol. 6, No. 2, Jun. 1977, 28 pages.
Myers, G., "A Fast Bit-Vector Algorithm for Approximate String Matching Based on Dynamic Programming", Journal of the ACM, vol. 46, No. 3, May 1999, pp. 395-415.
Payer et al., "Rapid Partial Substring Matching", U.S. Appl. No. 15/957,989, filed Apr. 20, 2018.
IBM, List of IBM Patents or Patent Applications Treated as Related, Apr. 19, 2018, 2 pages.
Unknown, "Count Occurrences of a Substring", rosettacode.org, last modified Jan. 14, 2018, printed Mar. 8, 2018, 60 pages, https://www.rosettacode.org/wiki/Count_occurrences_of_a_substring.
Lin et al., "Non-Overlapping Subsequence Matching of Stream Synopses", IEEE Transactions on Knowledge and Data Engineering, vol. 30, No. 1, Jan. 2018, pp. 101-114.
Zhikai et al., "Fast String Matching With Overlapped Substring Classifier in Deep Packet Inspection Systems", 2010 IEEE Global Telecommunications Conference, Dec. 6-10, 2010, 6 pages.
Franek et al., "A simple fast hybrid pattern-matching algorithm", Journal of Discrete Algorithms 5 (2007), Available online Jan. 16, 2007, pp. 682-695.
Indyk, P., "Faster algorithms for string matching problems: matching the convolution bound", 39th Annual Symposium on Foundations of Computer Science, Nov. 8-11, 1998, 8 pages.
Figuli et al., "Rapid Substring Detection Within a Data Element String", U.S. Appl. No. 16/109,836, filed Aug. 23, 2018.
Figuli et al., "Non-Overlapping Substring Detection Within a Data Element String", U.S. Appl. No. 16/109,840, filed Aug. 23, 2018.
IBM, List of IBM Patents or Patent Applications Treated as Related, Aug. 20, 2018, 2 pages.

* cited by examiner

RAPID CHARACTER SUBSTRING SEARCHING

BACKGROUND

The present disclosure relates to the field of digital computer systems, and more specifically, to a custom processor unit for rapid character substring searching.

Digitally represented text is often stored within a data storage device as strings of binary-encoded characters. Examples of widely accepted and used character encoding standards for electronically stored text include the American Standard Code for Information Interchange (ASCII) and the Unicode Transformation Format (UTF). A common text processing task performed by computers is a substring search or substring match that is used to identify occurrences of a "reference" string of characters within a larger "target" string of characters. There is an ever-increasing pool of digitally stored textual information, particularly non-structured human-readable information, available for use with computers and other electronic devices. In order to efficiently and effectively process this pool of digitally stored textual information there is a need for more rapid location and matching of information such as character substrings from within larger strings of binary-encoded characters.

SUMMARY

Embodiments may be directed towards a processor unit, a method and a computer program product for rapid searching for a reference substring within a target character string. Embodiments of the present disclosure can be freely combined with each other if they are not mutually exclusive.

Embodiments may be directed towards a processor unit configured to search within a target character string of length "L." The processor unit can include a plurality of vector registers each including a number "M" of vector elements, where each vector element of the M of vector elements includes "n" data bits used to contain a single binary-encoded character. The processor unit also includes an M×M matrix of comparators configured to perform a character-by-character, i.e., "character-wise," comparison of characters of a reference string stored in a first register of the plurality of vector registers with characters of a target string stored in a second register of the plurality of vector registers. The processor unit can include a logic gate associated with each diagonal of upper and lower triangular regions of the matrix of comparators. The logic gate can be configured to combine the results of comparators located along a respective diagonal of the matrix of comparators. The combination of comparator results can produce a bit vector that indicates characters of the target string that fully match characters of the reference string and characters of the target string that partially match characters of the reference string. The processor unit also includes a correction logic configured to suppress an indication of the partial match or an indication of the full match in the resulting bit vector.

Embodiments may also be directed towards a method for searching a target character string including a number "L" of characters by using a processor unit including a plurality of vector registers of "M" vector elements each, where each vector element is an "n"-bit element used to contain a single binary-encoded character. The method can include loading a reference string into a first register of the plurality of vector registers and loading a target string into a second register of the plurality of vector registers. The method can also include performing, using an M×M matrix of comparators, a character-by-character comparison of characters of the reference string with characters of the target string. The method can also include combining, with a plurality of logic gates, each logic gate of the plurality of logic gates associated a respective diagonal of the upper and lower triangular regions of the matrix of comparators, the results of comparators located along the respective diagonal of the matrix of comparators. The combining can produce a bit vector indicating characters of the target string that fully match characters of the reference string and indicating characters of the target string that partially match characters of the reference string. The method can also include suppressing an indication of the partial match or an indication of the full match in the resulting bit vector.

Embodiments may also be directed towards a computer program product for searching within a target character string of length "L," using at least one processor unit comprising a plurality of vector registers each including a number "M" of n-bit vector elements. Each vector element of the M n-bit vector elements can be configured to contain a binary-encoded character. The computer program product can comprise at least one non-transitory computer-readable storage medium having program instructions embodied therewith, the program instructions executable by the at least one processor unit to cause the at least one processor unit to perform a method. The method can include loading a reference string into a first register of the plurality of vector registers and loading a target string into a second register of the plurality of vector registers. The method can also include performing, using an M×M matrix of comparators, a character-by-character comparison of characters of the reference string with characters of the target string. The method can also include combining, with a plurality of logic gates, each logic gate of the plurality of logic gates associated a respective diagonal of the upper and lower triangular regions of the matrix of comparators, the results of comparators located along the respective diagonal of the matrix of comparators. The combining can produce a bit vector indicating characters of the target string that fully match characters of the reference string and indicating characters of the target string that partially match characters of the reference string. The method can also include suppressing an indication of the partial match or an indication of the full match in the resulting bit vector.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

The descriptions of embodiments of the present disclosure will be presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand.

A vector register can have a fixed length, i.e., size that includes a number "K" of bits determined to hold a single vector. The vector register can include a number "M" of vector elements, with each of the vector elements having a uniform size of "n" bits. The number of vector elements in the register can be referred to as the "width" of the register.

A string of "L" characters is generally referred to as "reference string," where the number of characters L is generally smaller than the number M of vector elements included within a vector register. Embodiments of the present disclosure can include performing a substring search of the L characters within a target or searchable character string that can occupy a full vector register, for example, having a size of M×n bits.

An upper triangular region of a comparator matrix can include a main diagonal and subsequent upper diagonals of the matrix. A lower triangular region of the comparator matrix can include the main diagonal and subsequent lower diagonals of the matrix.

The term "full match" is used herein to refer to a substring of L characters within the target string that fully match the reference string. The term "partial match" is used herein to refer to a partial substring of one or more characters of the target string that partially match the reference string. According to embodiments, the upper diagonals of the comparator matrix can be used to enable identification of the partial sub string of one or more characters at the end of the target string. In embodiments, the lower diagonals can be used to enable identification of the partial substring of one or more characters located at the beginning of the target string.

Embodiments of the present disclosure can be used to enable rapid and exact identification of full text string matches at any location in the target string and partial matches at either the beginning or end of the target string. Text string searches performed according to embodiments may not require re-evaluation that involves an additional shifting of the operand to be searched in order to find a partial match. In such searches, the substring matching is performed using short strings and may require a reevaluation in order to complete the searching. For relatively short text strings that fit within a vector register, the present method may enable identification of a substring match with a single comparison operation, in contrast to approaches which may require several re-evaluation operations. Text string searches performed according to embodiments may address the majority of searches involved in database applications, where searched text fields can be relatively short. For relatively long character strings, the present disclosure may accelerate the processing by returning full matches and at the same time indicating the occurrence of partial matches. This technique may eliminate the need for re-evaluation, when either a full match or a partial match occurs. Searches performed according to embodiments of the present disclosure, e.g., database or text-processing searches, can significantly enhance computing system performance and response time to text-based queries, i.e., finding a reference text substring within a larger, target text string.

Embodiments of the present disclosure can be useful in providing for the return of correct substring matches within the register size, by a custom processor unit, thus eliminating the necessity to verify whether a match is a "full" match. Some embodiments can provide more rapid search results than can be obtained through the use of established methods and/or hardware. The present method may avoid the necessity of an iterative process, e.g., using software, in order to identify partial matches. Partial matches may be identified through the hardware, i.e., processor unit, of the present disclosure. Embodiments of the present disclosure can be useful in allowing both the uncorrected result, that may contain also a partial match, and the corrected result, that contains only full-matches, to be used to facilitate detection of substrings that cross the register border with or without a reduced number of conditional jumps.

Embodiments of the present disclosure can include a custom processor unit, which may be fabricated as an integrated circuit (IC). Fabrication of such ICs can include a wide variety of IC types and technologies. For example, IC types can include full-custom designs, semi-custom designs such as application-specific integrated circuits (ASICs), field-programmable gate arrays (FPGAs), and programmable logic devices (PLDs). Such ICs can be fabricated in a variety of IC technologies, such as complementary metal-oxide semiconductor (CMOS) and silicon on insulator (SOI). According to embodiments, embodiments of the present disclosure, e.g., a custom processor unit, can also include a plurality of ICs, discrete electronic components, and other electronic components and hardware devices suitable for implementing the string searching and identification functions of the present disclosure in hardware.

According to embodiments, the logic gate includes an AND chain for performing a logical AND operation between the results of the comparators located along the diagonal. Using AND operations can provide an accurate comparison between the reference string and the target string. The AND chain may be implemented by using an integrated circuit (IC) logic design synthesis process that infers logic optimizations in order to choose the most suitable structure of the AND chain based on area and timing constraints. According to embodiments, the AND chain can include an AND gate connected to each adjacent, i.e., successive, pair of comparators of the diagonal. For an M×M matrix, the main diagonal may include a quantity M of comparators. According to embodiments, the main diagonal may therefore include M−1 AND gates that connect each adjacent pair of comparators of the main diagonal. In some embodiments, the AND chain may be configured as a tree structure with the comparators being the leaf nodes and the AND gates being the bi-partite branching points leading to the root. The last AND-gate of the AND chain may be used for performing the combination of the results of the comparators.

In some embodiments, the correction logic can include a register for storing the resulting bit vector, referred to as "s." The register can include a correction mask and a logic function for performing a logical AND operation between corresponding elements, i.e., bits, of the resulting bit vector and of the correction mask. In some embodiments, the correction mask may be held in a separate register, and in some embodiments the correction mask may not be held in a separate register. The use of a correction mask can enable a simplified method for suppressing the indication of the partial match or the indication of the full match in the resulting bit vector. In contrast to other substring searching and matching techniques, the present disclosure distinguishes between full match and partial match at the hardware level. This distinguishing may be achieved by applying the correction mask on an anticipated intermediate result that may contain a partial match at the end of a string fragment. The performing of the AND operation may result, for example, in a bit vector, referred to as "res," that includes a bit value indicating the beginning of a substring that fully match the reference string. The correction logic may further be configured to combine bit vector s and bit vector res in order to identify the substring, referred to as "p," that partially match the reference string e.g.:

$$p = s \text{ XOR } res$$

Embodiments can further include zero-detect logic for identifying empty n-bit vector elements of the first register and for generating a zero bit vector having logical values that indicate the identified empty n-bit vector elements and the non-empty n-bit vector elements. Embodiments can further include a logical OR logic circuit to perform a logical disjunction operation between each bit value of the zero bit vector and the output of a comparator. The comparator is configured to compare of an n-bit vector element stored in the first register to a corresponding n-bit vector element stored in the second register. This embodiment may enable the comparisons involving empty vector elements in the final result to be disregarded.

According to embodiments, the disjunction logic circuit includes OR gates, each OR gate connected between an AND gate and respective comparator. This may avoid, in case of empty characters, disruption of the AND chains formed by the AND gates.

According to embodiments, the correction logic includes a NOR logic circuit configured to identify empty elements of the first register and for generating a zero bit vector having values that indicate the position of the identified empty elements and the non-empty elements. According to embodiments, the correction logic also includes a shift unit, e.g., an arithmetic left shift unit, for shifting the zero bit vector and reversing the order of bits in the shifted zero bit vector to obtain a correction mask having the last, e.g., most right, L−1 bits set to zero. The purpose of the correction mask is to suppress a partial match at the end of the fragment, by for example forcing the upper L−1 result bits to a logical '0', where L is the length of the reference string. This embodiment may facilitate substring searches, using a method for hardware vector arithmetic that returns the exact substring match within a target string fragment occupying up to a full vector register, e.g., up to 16 characters in a 128-bit register.

According to embodiments, the resulting bit vector can include a bit value at a bit position that marks the beginning of a substring of the target string that fully matches the reference string and another bit value at another bit position marking the beginning of a substring of the target string that partially matches the reference string. According to embodiments, the correction logic is configured to maintain an indication of the full match results in the bit vector.

In some embodiments, the comparators are equality comparators, and in some embodiments, the comparators may include range comparators e.g., each of the comparators may be configured to perform the operation:

$$\text{NOT}((r>t) \text{ OR } (r<t)) = (r==t)$$

According to embodiments, the processor unit is configured such that the characters of the target string that partially match the reference string are located at the beginning or at the end of the target string. This may, for example, be performed by processing the diagonals of the upper or lower triangular region of the matrix of comparators respectively.

Figure 1:
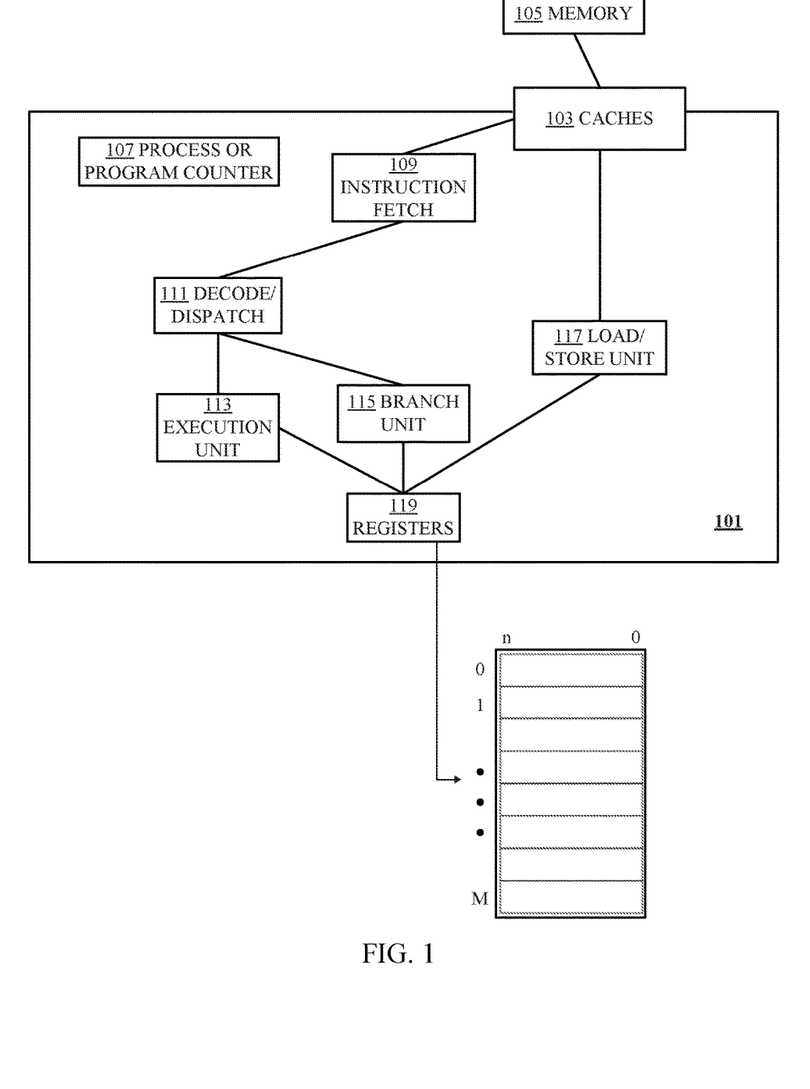
FIG. 1 is a block diagram depicting an example architecture of a processing unit, according to embodiments of the present disclosure.

FIG. 1 depicts an architecture of an example processor 101. One or more levels of cache 103 can be employed to buffer memory data in order to improve processor performance. The cache 103 is a high-speed buffer configured to hold cache lines of memory data that are likely to be used by example processor 101. Typical cache lines can include, for example, 64, 128 or 256 bytes of memory data. Cache 103 is caching data of higher hierarchical storage being main memory storage 105.

A program counter or instruction counter 107 can be used to contain the address of the current instruction to be executed. A program counter in certain processors, for example, can include 64 bits and can be truncated to 31 or 24 bits to support prior addressing limits. A program counter may typically be embodied in a program status word (PSW) of a computer such that it persists during context switching. Thus, a program in progress, having a program counter value, may be interrupted by, for example, the operating system, and can context switch from the program environment to the operating system environment. The PSW of the program maintains the program counter value while the program is not active, and the program counter, in the PSW, of the operating system is used while the operating system is executing. Typically, the program counter is incremented by an amount equal to the number of bytes of the current instruction. The program counter 107 is modified by either a context switch operation or a branch taken operation of a branch instruction for example. In a context switch operation, the current program counter value is saved in the program status word along with other state information about the program being executed, such as condition codes, and a new program counter value is loaded pointing to an instruction of a new program module to be executed. A branch taken operation is performed in order to permit the program to make decisions or loop within the program by loading the result of the branch instruction into the program counter 107.

Typically an instruction fetch unit 109 is employed to fetch instructions on behalf of the processor 101. The fetch unit 109 either fetches "next sequential instructions," target instructions of branch taken instructions, or first instructions of a program following a context switch. Examples of instruction fetch units often employ prefetch techniques to speculatively prefetch instructions based on the likelihood that the prefetched instructions might be used by the processor. For example, a fetch unit may fetch 16 bytes of instruction that includes the next sequential instruction and additional bytes of further sequential instructions.

The fetched instructions are subsequently executed by the processor 101. For example, the fetched instruction(s) are passed to a dispatch unit 111 of the fetch unit. The dispatch unit 111 decodes the instruction(s) and forwards information about the decoded instruction(s) to appropriate units 113, 115 and 117. An execution unit 113 may typically receive information about decoded arithmetic instructions from the instruction fetch unit 109 and may perform arithmetic operations on operands according to the opcode of the instruction. Operands are provided to the execution unit 113 preferably either from memory 105, vector registers 119 or from an immediate field of the instruction being executed. Results of the execution, when stored, are stored either in memory 105, vector registers 119 or in other machine hardware, such as control registers, PSW registers and the like.

As shown in FIG. 1, vector registers 119 may have a same size K=M×n where n is the number of bits that encodes a single character e.g., n=8 bits. For example, each of the vector registers 119 may store K bits. M is referred to as the width of the register.

The data stored in the vector registers 119 may be processed, for example, using a parallel vector processing technique e.g., using Single Instruction Multiple Data (SIMD) hardware e.g., vector registers 119 may hold data for vector processing done by SIMD instructions.

For example, fixed-sized groups of bytes known as "words" may be transferred from the memory 105 to the vector register 119. The number of bits in a word may for example be equal or smaller than the size K of the register 119. For example, vector load/store instructions provide the ability to take the words stored in memory 105 and pack them into sequential vectors/streams to be placed in vector registers 119. For example, the memory 105 may be configured to include 256-bit memory words. A 256-bit memory word may be partitioned into groups of K bits. During processing, each K-bit chunk, containing M characters, is loaded into a register 119.

Figure 2:
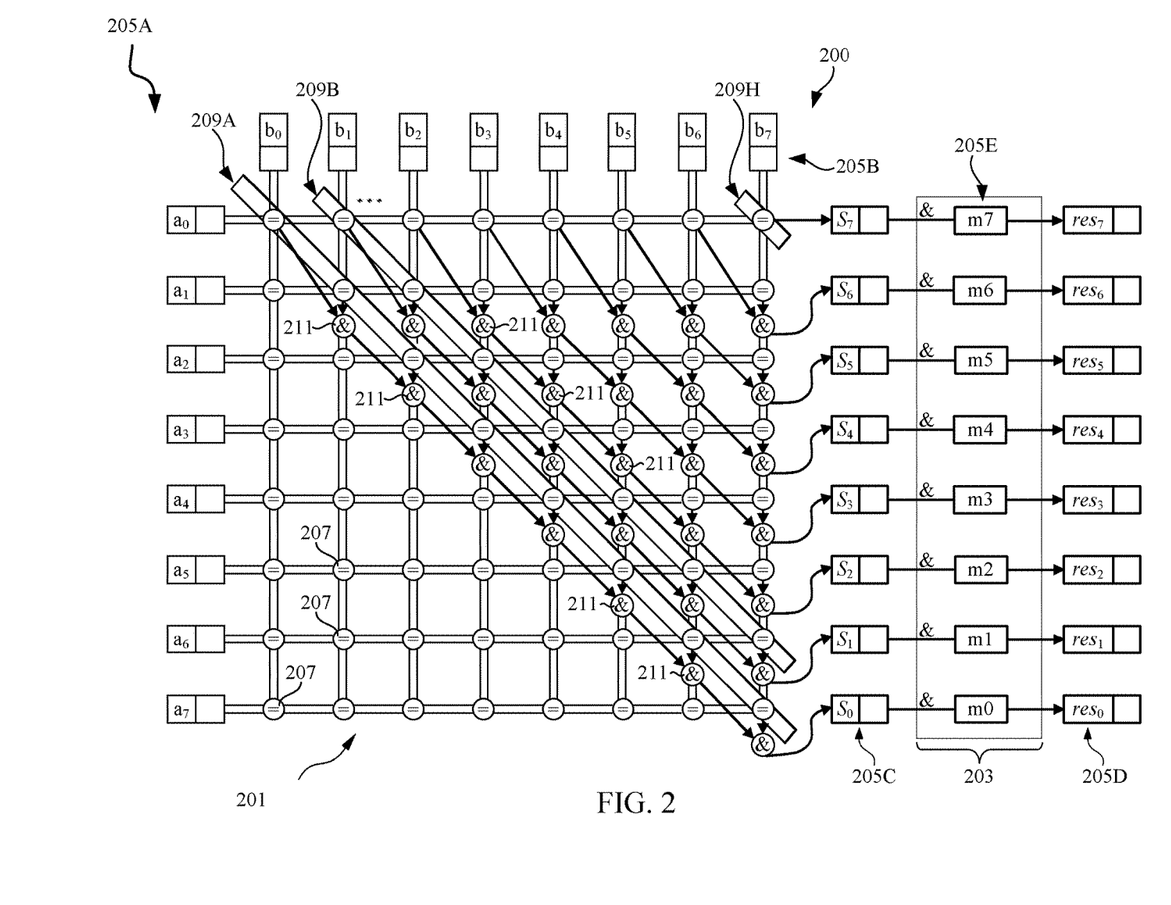
FIG. 2 is a diagram depicting components of a processing unit, according to embodiments consistent with the figures.

FIG. 2 is a diagram depicting components of a processing unit 200 according to embodiments consistent with the figures. The processing unit 200 may be configured to operate on an entire vector in one instruction. The processing unit 200 may be part of the execution units 113 of FIG. 1.

The processing unit 200 includes a comparator matrix 201 and a correction logic unit 203. According to embodiments, the comparator matrix 201 can be a hardware comparator matrix. The comparator matrix 201 may be configured to compare individual characters. The comparator matrix 201 includes comparators, collectively referred to as 207, such as character-wise equality comparators. In addition to or alternative to the equality comparison, the comparators 207 may be configured to perform a combination of greater-than '>' and less-than '<' operators e.g., operation:

NOT((r>t) OR (r<t))=(r==t).

The comparator matrix 201 can operate on two operands "a" and "b." Operand "a" may be, for example, a reference string to be searched and operand "b" may be a target string that is checked to see if it contains all and/or part of the operand "a." The reference string may include a number L of characters and the target string may include a number M of characters which can occupy a full vector register 119. The target and reference strings are compared character-by-character, i.e., "character-wise." By way of example, FIG. 2 shows an 8-character compare; i.e., M=8. The comparator matrix 201 is configured to compare any character of operand "a" 205A with any character of an operand "b" 205B and returns a logical '1' at matrix elements e(i)(j) that indicate a match of a character at a(i) with a character at b(j) or returns a logical '0' at elements that indicate a mismatch. "i" is an index for elements or characters a0-a7 of the operand "a" and "j" is an index for elements or characters b0-b7 of the operand "b." The elements e(i)(j) may for example be registered, e.g., by means of flip-flops. Each of the comparators 207 may be configured to fulfill the following equation:

$$e(i)(j) = \begin{cases} 1, & \text{for } a(i) = b(j) \\ 0, & \text{for } a(i) \neq b(j) \end{cases}$$

The operands "a" and "b" may be stored in respective registers 119. The comparator matrix 201 can be configured to receive or read data from a first register storing the operand "a" and a second register storing the operand "b." Each of the comparators 207 is configured to receive a respective pair of characters of the two operands "a" and "b." For that, the comparator matrix 201 includes 64 comparators 207 in order to compare all pairs of characters of the operands "a" and "b." For example, the main diagonal 209A of the comparator matrix 201 includes 8 comparators 207 that are configured to perform comparison between the pairs of characters (a0, b0), (a1, b1), (a2, b2), (a3, b3), (a4, b4), (a5, b5), (a6, b6) and (a7, b7) respectively. The subsequent upper diagonal 209B of the comparator matrix 201 includes 7 comparators that are configured to perform comparison between the pairs of characters (a0, b1), (a1, b2), (a2, b3), (a3, b4), (a4, b5), (a5, b6), and (a6, b7) respectively and so on. The last upper diagonal 209H of the comparator matrix 201 includes a single comparator 207 that is configured to perform comparison between the pair of characters (a0, b7).

The number of characters in operand "a" may be smaller than the number of characters in operand "b." This indicates that the search is a substring search. The processing unit 200 further includes a logic gate that may enable an optimal substring search. The logic gate may for example be used to combine the results of the comparators 207 along each of the diagonals of the upper or lower triangular region of the matrix. In this example, it is described that the logic gate may be used to combine the results of the comparators 207 along each of the upper diagonals 209A-G. The logic gate may be aggregate logic as shown in FIG. 2 that for example forms logical AND chains across the upper diagonals 209A-G of the comparator matrix 201. Each of the upper diagonals 209A-G includes a number of AND gates, collectively referred to as 211, which is equal to the number of comparators in the respective diagonal minus 1. The AND gates may be configured to connect adjacent pair of comparators as shown in FIG. 2. For example, an AND chain across the upper diagonal 209A which includes 7 AND gates (=8−1) may be configured to perform a logical AND operation between the results of the comparators of the diagonal 209A. This results in a bit vector s 205C including the result of comparators of each of the upper diagonals 209A-H. For example, the results are ordered in the bit vector s such that elements s0-s7 including the result of comparators of the upper diagonals 209A-H respectively. This results in ordered compares s0-s7 of consecutive characters. For example, the results of each comparator 207 of the upper diagonal 209A may be combined and the combined result may be stored in the first element s0 of the bit vector s 205C.

The resulting bit vector s 205C may contain indication of both, full matches and partial matches that occur at the end of the target string. Bit vector s 205C may serve as an anticipated intermediate result as it can't distinguish between full match and partial match. For example, if the operand "b" includes operand "a" and part of operand "a," the bit vector s 205C includes a bit value at a bit position that marks the beginning of a substring of the operand "b" that fully matches the operand "a" and another bit value at another bit position marking the beginning of a substring of the operand "b" that partially matches the operand "a." For instance, the search, see FIG. 3, of a reference string "noon" within a target string "highnoon" returns s=00001001. The logical '1' in the fifth bit from left originates from a full match, yet the logical '1' in the last bit, i.e., most right, originates from a partial match.

In order to suppress partial matches from the resulting bit vector s 205C, a conjunction of bit vector s 205C with a correction mask m0-m7 205E, e.g., m7=0, m6=0, m5=0, m4=1, m3=1, m2=1, m1=1 and m0=1, that masks out the upper L-1 bits (001) of the bit vector s 205C may be performed using the correction logic 203. This is based on that a substring with a length of L characters cannot be matched with less than L characters. For example, the correction logic 203 may be configured to generate the correction mask 205E and perform the conjunction, i.e., logical AND operation, of the bit vector s 205C and the correction mask 205E.

Figure 3:
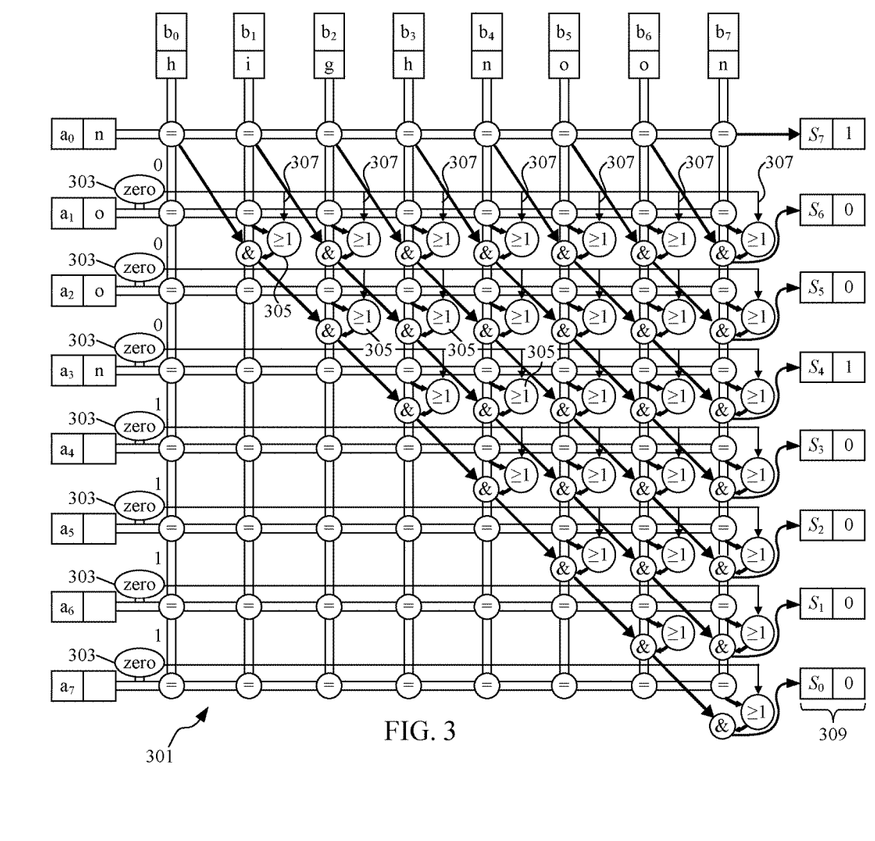
FIG. 3 is a block diagram depicting an example comparator matrix of the processing unit, according to embodiments consistent with the figures.

FIG. 3 is a block diagram depicting an example comparator matrix 301 of the processing unit 200. In this example of FIG. 3, operand "a," e.g., of FIG. 2, is a reference string "noon" and operand "b," e.g., of FIG. 2, is a target string "highnoon." The comparator matrix 301 of FIG. 3 is consistent with the comparator matrix 201 of FIG. 2.

Since the vector register's width, M=8, is greater than the number L=4 of characters of the reference string "noon," the vector register that stores the reference string may include empty elements. For example, in FIG. 3 the first 4 characters in the reference string represent the word "noon," yet the trailing 4 characters are empty and represented by 0x00 in the character encoding. In this case, the comparators 207 may issue a logical '0' at those positions corresponding to the empty elements, which may cause a disruption of the AND chains if the comparators 207 were directly connected to the AND gates 211. To avoid this situation, all rows of the comparator matrix 301 that are associated with empty elements may be forced to a logical '1' before sourcing the corresponding AND gates 211. For that, the comparator matrix 301 may further include a zero-detect logic. The zero-detect logic is configured to generate a zero bit vector having values that indicate empty elements of the reference string and the non-empty elements of the reference string. The zero-detect logic includes elements 303 that are associated with rows of the comparator matrix 301. For example, elements 303 may be associated with M-1 rows of the comparator matrix 301 having comparators 207. In the example of FIG. 3, seven elements 303 are associated with the last seven rows of the comparator matrix 301. Each element of the elements 303 is configured to output a logical '1' if the corresponding binary-encoded character is 0x00, else a logical '0':

$$\text{zero}(i) = \begin{cases} 1, & \text{for } a(i) = 0x00 \\ 0, & \text{for } a(i) \neq 0x00 \end{cases}$$

The zero-detect logic can be realized, for example, by NOR trees over the bits of a binary-encoded character e.g., each of the elements 303 may be realized by a NOR tree over the bits of corresponding binary-encoded character. As indicated in FIG. 3, for each of the 4 trailing characters a4-a7, the respective element 303 outputs a value "1." For the characters a1-a3 the respective element 303 outputs a value "0." The resulting zero bit vector may be "0001111." The first character a0 may or may not be associated with an element 303.

The zero-detect logic further includes OR gates, collectively referred to as 305, wherein each OR gate 305 is connected between an AND gate 211 and respective comparator 207. Each of the values of the zero bit vector may be input to each of the OR gates 305 of the row associated with the value of the zero bit vector as indicated by rows 307. The OR gates 305 may be used for logical disjunction, i.e., a logical OR operation, of comparator results and zero-detects in order to realize the forcing of a logical '1' in case of empty characters a4-a7. The outcome of the structure in FIG. 3 is a bitmask, or bit vector, s 309 that contains a logical '1' at bit positions that mark the beginning of a substring within the target string. This is expressed and generalized also by the following equation:

$$s_j = e(0)(j) \bigwedge \prod_{i=1}^{M-1-j} e(i)(i+j) \bigvee \text{zero}(i)$$

Figure 4:
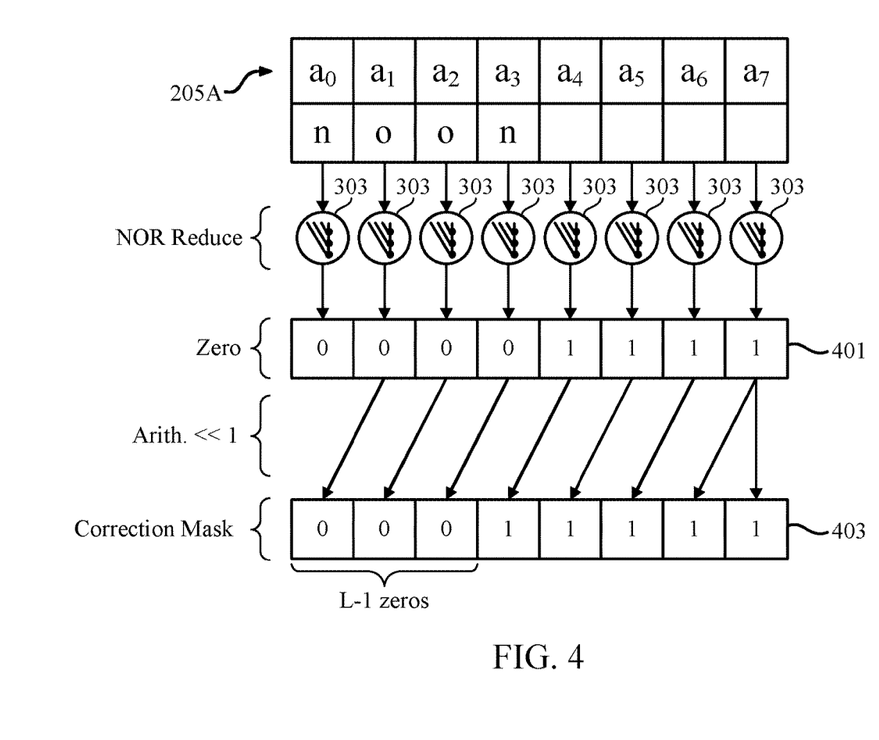
FIG. 4 is a block diagram depicting the operation of a correction logic for generating a correction mask, according to embodiments consistent with the figures.

FIG. 4 is a block diagram depicting the operation of correction logic 203 for generating the correction mask 403. The correction logic 203 can include elements 303 of the zero-detect logic or elements similar to elements 303 but are not part of the zero-detect logic. Each of the elements 303 receives as input a respective character of the reference string, operand "a," and outputs a respective value as described with reference to FIG. 3. FIG. 4 shows the resulting bit vector 401 including outputs 0 or 1.

The correction logic 203 further includes a shift unit that is configured to receive the bit vector 401 and to perform an arithmetic shift left by 1 bit as shown in FIG. 4 and to reverse the bit-order. This results in a bit-vector for the correction mask 403 that contains L-1 zeros in its upper bits and else ones. The exact substring match is then:

$$res_j = s_j \wedge cm_j,$$

where cm, or m, refers to the correction mask 403. The correction mask 403 may have the following values: m7=0, m6=0, m5=0, m4=1, m3=1, m2=1, m1=1 and m0=1.

To indicate a partial match "p," the correction logic 203 may be configured to perform an XOR combination of bit vector s 205C and bit vector res 205D as follows:

$$p = s \text{ XOR } res$$

This logic may be further optimized by making use of the fact that bit vector res 205D is a subset of bit vector s 205C. For example, bit vector res 205D may not have ones in places where bit vector s 205C doesn't have ones, yet the opposite is possible. If bit vector s 205C XOR bit vector res 205D is defined by:

$$(s \wedge (\text{NOT } res)) \vee ((\text{NOT } s) \wedge res),$$

then it may be known with the assumption above that the second term may be always all zero. The correction logic 203 may be configured to simplify operations for the detection of partial matches as redefined in the following equation:

$$p = s \wedge \overline{res}$$

Figure 5:
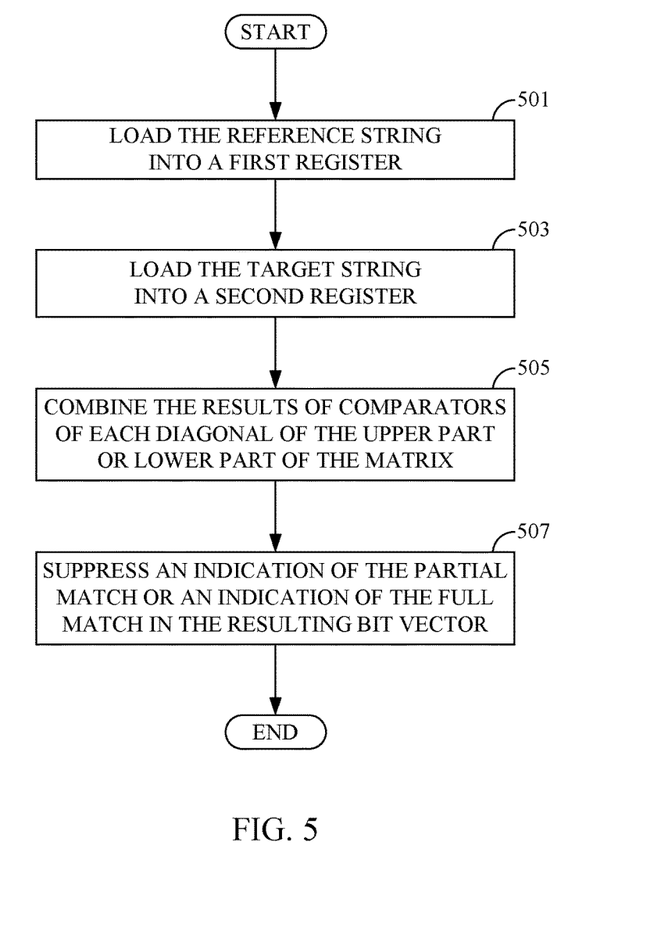
FIG. 5 is a flow diagram depicting a method for searching a string of "L" characters, according to embodiments consistent with the figures.

FIG. 5 is a flowchart of a method for searching for a reference string of L characters using a processor unit e.g., 200 including vector registers of M vector elements each. A vector element is an n-bit element used for storing a binary-encoded character. The case where L<M indicates that a substring search of the L characters is performed.

In step 501, the reference string is loaded in a first register of the registers 119. In step 503, a target string is loaded in a second register of the registers 119. The target string may be checked to determine if it contains the full reference string and/or only part of the reference string.

For each diagonal, e.g., upper diagonals 209A-H, of the upper or lower triangular region of the comparator matrix 201, the results of comparison of the comparators 207 of the diagonals 209A-H may be combined in step 505. This results in a bit vector indicating characters of the target string that fully match the reference string and characters of the target string that partially match the reference string.

In step 507, an indication of the partial match or an indication of the full match in the resulting bit vector may be suppressed. This may be accomplished, for example, by performing a bitwise operation on the resulting bit vector. For example, step 507 may return a match message indicating an exact substring match result of the substring search or a mismatch if no exact substring match is found.

Aspects of the present invention are described herein with reference to flowchart illustrations and/or block diagrams of methods, apparatus/systems, and computer program products according to embodiments of the invention. It will be understood that each block of the flowchart illustrations and/or block diagrams, and combinations of blocks in the flowchart illustrations and/or block diagrams, can be implemented by computer-readable program instructions.

The present invention may be a system, a method, and/or a computer program product. The computer program product may include a non-transitory computer-readable storage medium, or media, having computer-readable program instructions thereon for causing a processor to carry out aspects of the present invention.

The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer-readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media, e.g., light pulses passing through a fiber-optic cable, or electrical signals transmitted through a wire.

Computer-readable program instructions described herein can be downloaded to respective computing/processing devices from a computer-readable storage medium or to an external computer or external storage device through a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present invention.

These computer-readable program instructions may be provided to a processor of a general purpose computer, special purpose computer, or other programmable data processing apparatus to produce a machine, such that the instructions, which execute through the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein includes an article of manufacture including instructions which implement aspects of the function/act specified in the flowchart and/or block diagram block or blocks.

The computer-readable program instructions may also be loaded onto a computer, other programmable data processing apparatus, or other device to cause a series of operational steps to be performed on the computer, other programmable apparatus or other device to produce a computer-implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A processor unit for searching, within a target character string, for a reference character string of length "L," the processor unit comprising a plurality of vector registers each including a number "M" of n-bit vector elements, each vector element of the M n-bit vector elements configured to contain a binary-encoded character, the processor unit further comprising:
   an M×M matrix of comparators configured to perform a character-by-character comparison of characters of a reference string stored in a first register of the plurality of vector registers with characters of a target string stored in a second register of the plurality of vector registers;
   a plurality of logic gates, each logic gate of the plurality of logic gates associated with a respective diagonal of the matrix of comparators, each logic gate of the plurality of logic gates configured to combine the results of comparators located along the respective diagonal of the matrix of comparators, the plurality of logic gates configured to produce a bit vector indicating at least one item selected from the group consisting of: characters of the target string that fully match characters of the reference string and characters of the target string that partially match characters of the reference string; and
   correction logic configured to suppress an indication of at least one item selected from the group consisting of: a partial match in the resulting bit vector and a full match in the resulting bit vector.

2. The processor unit of claim 1, wherein the plurality of logic gates includes an AND gate chain configured to perform a logical AND operation between outputs of comparators located along a diagonal of the matrix of comparators.

3. The processor unit of claim 2, wherein the AND gate chain includes an AND gate connected to outputs of each adjacent pair of comparators of the diagonal of the matrix of comparators.

4. The processor unit of claim 1, the correction logic including a register configured to store the resulting bit vector, the register including a correction mask and logic for performing a logical AND operation between corresponding elements of the resulting bit vector and of the correction mask.

5. The processor unit of claim 1, the plurality of logic gates further including:
   zero-detect logic configured to identify empty n-bit vector elements of the first register and to generate a zero bit vector including logical values indicating the identified empty n-bit vector elements and indicating the non-empty n-bit vector elements; and
   a logic circuit for performing a logical OR operation between each bit value of the zero bit vector and the output of a corresponding comparator, wherein the corresponding comparator output results from the comparison of an n-bit vector element stored in the first register to an n-bit vector element stored in the second register.

6. The processor unit of claim 5, the logic circuit for performing logical OR operation including a plurality of OR gates, wherein each OR gate of the plurality of OR gates is connected between an AND gate and a respective comparator.

7. The processor unit of claim 1, wherein the correction logic includes:
   a NOR logic circuit configured to identify empty elements of the first register and further configured to generate a zero bit vector having values indicating of positions of the identified empty elements and non-empty elements;
   a shift unit configured to shift the zero bit vector and reverse the order of bits in the shifted zero bit vector, the shifting and reversing of the order of bits producing a correction mask having the last L−1 bits set to zero; and
   a combination logic configured to combine the correction mask with the resulting bit vector for the suppression.

8. The processor unit of claim 1, wherein the resulting bit vector includes a first bit value located in a first bit position that indicates a beginning of a substring of the target string that fully matches the reference string and a second bit value at a second bit position that indicates the beginning of a substring of the target string that matches a portion of the reference string.

9. The processor unit of claim 1, wherein the correction logic is configured to maintain an indication of the characters of the target string that fully match characters of the reference string in the bit vector.

10. The processor unit of claim 1, wherein the comparators are equality comparators.

11. A method for searching within a target character string of length "L," using a processor unit comprising a plurality of vector registers each including a number "M" of n-bit vector elements, each vector element of the M n-bit vector elements configured to contain a binary-encoded character, the method comprising:
   loading a reference string into a first register of the plurality of vector registers;
   loading a target string into a second register of the plurality of vector registers;

performing, using an M×M matrix of comparators, a character-by-character comparison of characters of the reference string with characters of the target string;

combining, with a plurality of logic gates, each logic gate of the plurality of logic gates associated a respective diagonal of the matrix of comparators, the results of comparators located along the respective diagonal of the matrix of comparators, the combining producing a bit vector indicating at least one item selected from the group consisting of: characters of the target string that fully match characters of the reference string and characters of the target string that partially match characters of the reference string; and suppressing, with a correction logic, an indication of at least one item selected from the group consisting of: a partial match in the resulting bit vector and a full match in the resulting bit vector.

12. The method of claim 11, wherein the suppressing includes performing a bitwise operation on the resulting bit vector.

13. The method of claim 12, further comprising:
creating a correction mask having rightmost L−1 bits set to a logical "0"; and
performing a logical AND operation between the resulting bit vector and the correction mask for use in performing the suppression.

14. The method of claim 11, further comprising:
identifying empty elements of the first register and, in response to the identifying, generating a zero bit vector including values that indicate identified empty elements and non-empty elements; and
using the zero bit vector to disregard comparisons involving the empty elements.

15. The method of claim 11, wherein bits of the resulting bit vector are ordered so that a first bit includes the results of comparators along a main diagonal of the matrix, and so that subsequent bits include the results of comparators located along respective subsequent diagonals adjacent to the main diagonal.

16. A computer program product for searching, within a target character string, for a reference character string of length "L," using at least one processor unit comprising a plurality of vector registers each including a number "M" of n-bit vector elements, each vector element of the M n-bit vector elements configured to contain a binary-encoded character, the computer program product comprising at least one non-transitory computer-readable storage medium having program instructions embodied therewith, the program instructions executable by the at least one processor unit to cause the at least one processor unit to perform a method comprising:

loading a reference string into a first register of the plurality of vector registers;

loading a target string into a second register of the plurality of vector registers;

performing, using an M×M matrix of comparators, a character-by-character comparison of characters of the reference string with characters of the target string;

combining, with a plurality of logic gates, each logic gate of the plurality of logic gates associated a respective diagonal of the matrix of comparators, the results of comparators located along the respective diagonal of the matrix of comparators, the combining producing a bit vector indicating at least one item selected from the group consisting of: characters of the target string that fully match characters of the reference string and characters of the target string that partially match characters of the reference string; and suppressing, with a correction logic, an indication of at least one item selected from the group consisting of: a partial match in the resulting bit vector and a full match in the resulting bit vector.

* * * * *